United States Patent
Booz et al.

(10) Patent No.: US 9,865,751 B2
(45) Date of Patent: Jan. 9, 2018

(54) METHOD FOR PRODUCING PRETINNED CONNECTORS FOR PV CELLS AND METAL FOIL WITH A CORRUGATED STRUCTURE RUNNING IN ONE DIRECTION

(75) Inventors: Thomas Booz, Roth (DE); Fabian Distelrath, Roth (DE)

(73) Assignee: Schlenk Metallfolien GmbH & Co., KG, Roth-Bernlohe, Deutschland (DE)

( * ) Notice: Subject to any disclaimer, the term of this patent is extended or adjusted under 35 U.S.C. 154(b) by 136 days.

(21) Appl. No.: 13/980,616

(22) PCT Filed: Jan. 19, 2012

(86) PCT No.: PCT/EP2012/050816
§ 371 (c)(1),
(2), (4) Date: Oct. 9, 2013

(87) PCT Pub. No.: WO2012/098205
PCT Pub. Date: Jul. 26, 2012

(65) Prior Publication Data
US 2014/0023878 A1    Jan. 23, 2014

(30) Foreign Application Priority Data
Jan. 20, 2011    (DE) .................. 10 2011 009 006

(51) Int. Cl.
*H01L 31/02*    (2006.01)
*H01L 31/05*    (2014.01)
(Continued)

(52) U.S. Cl.
CPC ...... *H01L 31/02021* (2013.01); *C23C 24/106* (2013.01); *H01L 31/0508* (2013.01);
(Continued)

(58) Field of Classification Search
USPC .......................................... 22/245
See application file for complete search history.

(56) References Cited

U.S. PATENT DOCUMENTS 4,301,322 A  *  11/1981  Amick .................. 136/256
5,385,848 A  *  1/1995   Grimmer ................ 438/62
(Continued)

FOREIGN PATENT DOCUMENTS

DE    3612269 A1    10/1987
DE    4038765 A1    6/1992
(Continued)

OTHER PUBLICATIONS

International Preliminary Report on Patentability dated Aug. 1, 2013 for PCT/EP2012/050816.
(Continued)

*Primary Examiner* — Devang R Patel
(74) *Attorney, Agent, or Firm* — Buchanan Ingersoll & Rooney PC

(57) ABSTRACT

To produce pretinned strips of connectors for PV cells, a metal foil (30) is guided through a roll gap (46) of a rolling mill in which at least one work roll (48) has a surface with a corrugated structure with the result that a corrugated structure which has crests or peaks and troughs is embossed into at least one side of the metal foil (30), soldering tin in the form of solder preforms (54) is applied to the side of the metal foil (30) with the embossed corrugated structure, wherein the soldering flux necessary for pretinning has been applied in advance to the solder preforms or the metal foil, the solder preforms (54) are connected to the metal foil (30) or applied to it and melted on and the pretinned metal foil (30) with the embossed corrugated structure is separated into parallel ribbons. The solder preforms (54) are sufficiently thick for the corrugated structure to be at least full after the solder preforms (54) have been melted on.

9 Claims, 4 Drawing Sheets

Figure 1:
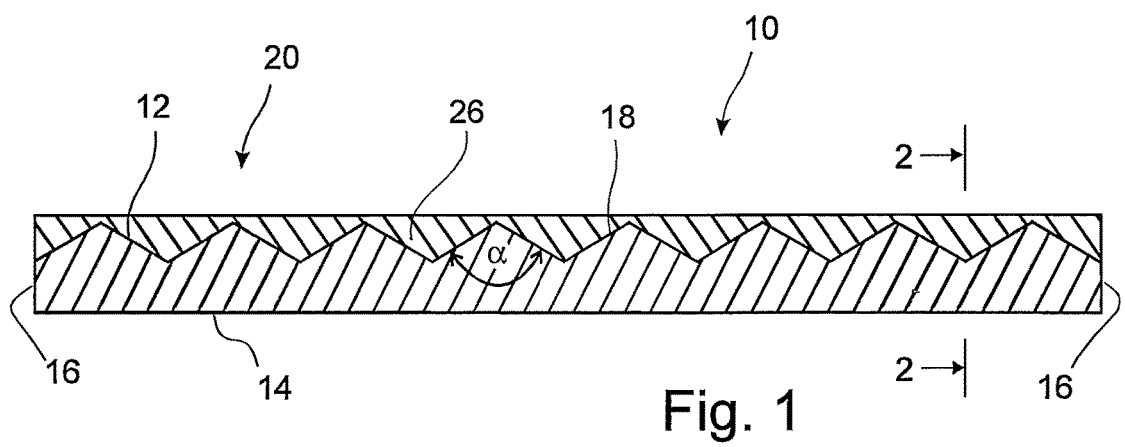

(51) Int. Cl.
*C23C 24/10* (2006.01)
*H01L 31/054* (2014.01)

(52) U.S. Cl.
CPC ......... *H01L 31/0547* (2014.12); *Y02E 10/52* (2013.01); *Y10T 428/1241* (2015.01)

(56) References Cited

U.S. PATENT DOCUMENTS

| | | | |
|---|---|---|---|
| 7,476,800 B2* | 1/2009 | Berghofer et al. | 174/36 |
| 7,998,760 B2* | 8/2011 | Tabe | 438/15 |
| 2007/0125415 A1 | 6/2007 | Sachs | |
| 2008/0236655 A1* | 10/2008 | Baldwin | H01L 31/188 136/251 |
| 2009/0255569 A1 | 10/2009 | Sampsell et al. | |
| 2011/0048492 A1* | 3/2011 | Nishiwaki | H01L 31/0504 136/244 |
| 2011/0065226 A1* | 3/2011 | Luo et al. | 438/67 |
| 2011/0311790 A1* | 12/2011 | Okada et al. | 428/209 |
| 2012/0160294 A1* | 6/2012 | Phu | H01L 31/0508 136/244 |

FOREIGN PATENT DOCUMENTS

| | | |
|---|---|---|
| DE | 102006035626 | 2/2008 |
| DE | 102008044354 A1 | 6/2010 |
| EP | 1626443 A1 | 2/2006 |
| JP | 2002-280591 A | 9/2002 |
| JP | 2005-191125 A | 7/2005 |
| JP | 2008-543003 | 11/2008 |
| JP | 2009-260190 | 11/2009 |
| JP | 2009-295860 A | 12/2009 |
| JP | 4646558 B2 | 3/2011 |
| WO | WO 2006128203 A1 | 12/2006 |

OTHER PUBLICATIONS

Official Action dated Dec. 14, 2014 for South Korean Patent Appln. No. 10-2013-7019268.
Preu, R., "Optimisation of Cell Interconnectors for PV Module Performance Enhancement", 14th European Photovoltaic Solar Energy Conference, Barcelona, Spain, Jun. 20-Jul. 4, 1997, pp. 278-281.
Sachs, Emanuel M. et al., "Light-Capturing Interconnect Wire for 2% Module Power Gain", 24th European Photovoltaic Solar Energy Conference, Hamburg, Germany, Sep. 21-25, 2009, pp. 3222-3225.
Search Report dated Dec. 13, 2011 for German Appln. No. 102011009006.1.
International Search Report dated Feb. 1, 2013 for PCT/EP2012/050816.
Japanese Office Action corresponding to Japanese Patent Application No. 2013-549811, dated Mar. 3, 2016, (5 pages).

* cited by examiner

METHOD FOR PRODUCING PRETINNED CONNECTORS FOR PV CELLS AND METAL FOIL WITH A CORRUGATED STRUCTURE RUNNING IN ONE DIRECTION

The invention relates to a method for producing pretinned connectors for PV cells (photovoltaic cells), wherein the connectors have a corrugated structure running in longitudinal direction. The invention further relates to a metal foil with a corrugated structure, running in longitudinal direction, on at least one side.

A connector for PV cells is a strip of electrically conductive material which has a flat cross-section with a first and a second broad side extending over its entire length and with two narrow sides which each connect to the opposite walls of the broad sides. At least the first broad side has a corrugated structure running in longitudinal direction of the strip.

Connectors for PV cells are usually supplied wound as long ribbons on rolls and are then cut off individually from these ribbons. The definition of the first and second broad side or the top and bottom is governed by the winding in the finished supplied form and can to this extent be as desired.

Connectors are used in photovoltaics in order to connect the individual PV cells to a PV module. Five PV cells for example are series-connected by means of the connectors. Each connector creates the electrical connection between two consecutive cells of a PV module. As a rule the connectors are used with PV cells of crystallized silicon. However, they can also be used in thin-film PV cells. The connectors are to securely join together the electric poles (positive and negative) of adjacent cells within the PV module, corresponding to the desired connection. As the PV cells are connected in series (positive to negative) and the orientation of the poles of each cell is the same, the connector is soldered to the top (so-called "sunny side") of one cell and then to the bottom (so-called "shady side") of the next cell.

Conventional connectors of PV cells are strips of electrically conductive material, generally copper, wherein both broad sides are smooth. Depending on the production method, the strip is pretinned with a soft solder on all sides (dip-tinned rolled wire) or on two sides (slit ribbon). The solder coating is applied evenly along the entire length of the connector, generally evenly in the same thickness on both sides. The crosswise thickness distribution of the tin layer may vary depending on the production method. In the case of dip-tinned wire a lens forms. With the cut ribbon the thickness of the solder layer remains constant over the width.

PV cell connectors with a corrugated structure are known from the publication "OPTIMISATION OF CELL INTERCONNECTORS FOR PV MODULE PERFORMANCE ENHANCEMENT", 14th EUROPEAN PHOTOVOLTAIC SOLAR ENERGY CONFERENCE, BARCELONA, SPAIN, 30 Jun. to 4 Jul. 1997, as well as from US-2007/0125415 A1 and from JP-2006-013406. As described in these publications, with an optimum angle α at the peaks of the corrugated structure of 100-140°, preferably 120°, approximately 80% of the light striking the connectors can be made usable for electricity generation by total reflection within the PV cell, whereby the overall efficiency of the PV cell is improved by approximately 2%. The surface of the corrugated structure can be silver-plated to increase the reflection. It is not stated in these published documents how the connectors are to be soldered to the PV cells. Conventional connectors with flat broad sides are pretinned by dip soldering. With connectors with a corrugated structure, however, this does not lead to an adequate pretinning which allows the connectors to be soldered in an automated procedure. Connectors with a corrugated structure could therefore be soldered onto PV cells only by external solder feed, e.g. by means of a dispensing head.

The object of the invention is to provide a method for producing pretinned PV cell connectors with a corrugated structure on at least one of the two broad sides, so that the pretinned connectors can be easily and reliably soldered to PV cells.

According to the invention, this object is achieved in that
- a metal foil is guided through a roll gap of a rolling mill in which at least one work roll has a surface with a corrugated structure with the result that a corrugated structure which has crests or peaks and troughs is embossed into at least one side of the metal foil,
- soldering tin in the form of solder preforms (foil sections) is applied to the side of the metal foil which has an embossed corrugated structure, wherein the soldering flux necessary for the tinning has been applied in advance to the solder preforms or the metal foil,
- the solder preforms are melted onto the metal foil, and
- the tinned metal foil with the embossed corrugated structure is separated into parallel ribbons, wherein the solder preforms are sufficiently thick for the corrugated structure to be full after the solder preforms have been melted on.

The ribbons can be wound onto narrow or transverse rolls. The individual connectors are then cut off from these ribbons.

Before melting, the solder preforms can first be connected or fixed to the metal foil. The solder preforms can be connected to the metal foil by placing the pre-cut solder preforms onto the metal foil by means of a suction gripper, the solder preforms still held in place by the suction gripper are temporarily attached pointwise with a first hot embossing head to the metal foil, the temporarily attached solder preforms are then pressed with a second hot embossing head over the whole surface with the metal foil, wherein the temperature is a few degrees Celsius below the liquidus temperature, with the result that the solder is soft or pulpy, and finally the temporarily attached solder performs that have been pressed over the whole surface are melted on.

Alternatively, the solder preforms can also easily be placed on the metal foil to which soldering flux has been applied in advance, with the result that it is still damp. So that the solder preforms do not slip, they are gently pressed onto the metal foil by means of a hold-down device. The temporary attachment of the solder preforms using the first hot embossing head is then dispensed with.

The solder preforms are sufficiently thick for the pretinning to at least fill the corrugated structure running in longitudinal direction. In order to make the processing in long lengths of pretinned connectors possible to be made from the metal foil, the pretinned areas expediently stand only slightly higher than the crests or peaks of the uncoated corrugated structure. The corrugated structure contains nearly all of the solder material with the result that the solder material stands only slightly higher than the crests or peaks of the corrugated structure. The small excess is expedient for a subsequent successful soldering of the connectors.

The other work roll of the rolling mill preferably also has a corrugated structure, with the result that the metal foil contains a corrugated structure on both sides. The design of the corrugated structure can be identical or different on both sides.

If the metal foil has the corrugated structure only on one side, the top, the other, smooth side, the bottom, can be tinned over its whole surface e.g. by wave soldering. The top need then be tinned only in the areas which later become the areas with which the PV cell connectors to be produced are soldered onto the back of the PV cells.

The metal foil is preferably 0.1 to 0.25 mm thick and 30 to 90 mm wide. The work rolls preferably have a surface with a corrugated structure with a peak-to-peak distance of 150-250 µm and a depth of approximately 30 to 50 µm, with the result that the optimum angle α of 100-140°, preferably 120°, results at the peaks of the corrugated structure. The corrugated structure of the metal foil then has crests or peaks and troughs running in longitudinal direction or machine direction of the rolling mill.

With peak-to-peak distances of the corrugated structure of significantly less than 150 µm, the yield of PV cells is reduced by losses at the tips (crests or peaks) of the grooves. The longer the selected distance, the deeper the profile of the corrugated structure, which can lead to manufacturing problems. Moreover, the strip as a whole therefore becomes unnecessarily thick. A peak-to-peak distance of approximately 150 µm is particularly preferable.

The metal foil used can be either bare or coated on one or both sides with silver, tin or nickel. The metal foil is preferably coated with silver to improve the reflection properties of the PV cell connector produced from same. The pretinning is applied to the thin silver layer.

Preferably, only those areas of the corrugated metal foil which then later form the sections of the connector which are soldered to the PV cells are pretinned. For this purpose, the soldering tin is applied to the metal foil in the form of solder preforms (foil sections). The solder preforms are strips, the width of which corresponds to the length of the first and second areas of the strip of the connector, thus somewhat less than the lengths of the sides of the PV cells for which the strips are to be produced.

The length of the solder surfaces of the two sides can be different. The solder surface(s) can also be intrinsically non-continuous. As supplied, i.e. in long ribbons wound on rolls, the ribbons of the PV cell connectors expediently have an intrinsically constant sequence of the solder surfaces of the first and second areas on the respective broad side. The lengths of the uncoated surfaces in front of and behind a solder surface may differ. However, they preferably repeat at the same frequency. The position of the two sequences on the first and second broad side is generally fixed and defined relative to each other.

With a metal foil from which connectors for six-inch cells are to be produced, the solder preforms are typically 145 mm long in longitudinal direction, i.e. slightly shorter than the length of the edge of the six-inch cells.

If both sides of the metal foil are pretinned the preforms on one side preferably have a distance in a longitudinal direction from those on the other side which roughly corresponds to the distance between two PV cells to be connected to one another. The first areas and the second areas of the PV cell connector later cut from the metal foil then also have this gap in longitudinal direction. This distance is typically 15 mm. As the connectors are cut from a continuous ribbon, a cutting tolerance of 0.5 mm must also be taken into account. Overall there results a typical connector length and thus a grid of the solder preforms of 305.5 mm.

With other PV cells the first and second areas and accordingly the dimensions of the solder preforms in longitudinal or conveyance direction are correspondingly smaller or larger.

The corrugated structure of the work rolls can be circular or axis-parallel and the corrugated structure in the foil runs accordingly in machine direction or direction of transport through the roll gap or transverse to same.

If the corrugated structure of the work rolls is circular the foil is still cut in longitudinal direction into narrow, parallel ribbons, wherein the width of the ribbon is equal to the width of the PV connectors. This ribbon is generally wound onto narrow, single-layer or transverse rolls. The individual connectors are then cut off from these ribbons.

If the corrugated structure of the work rolls is axis-parallel the width of the ribbon is expediently equal from the outset to the length of the PV connectors to be produced. The ribbon is wound onto a single-layer roll and the PV connectors are then cut off from the ribbon.

Preferably the corrugated structure of the work rolls is circular and the corrugated structure of the foil runs in longitudinal direction.

The uncoated surfaces between the solder surfaces can be provided with an insulation layer. Before or—preferably—after the placement, temporary attaching, hot pressing over the whole surface and melting on of the solder preforms, an insulation foil can be applied by hot sealing.

The metal foil generally consists of copper.

The dimensions mentioned above of the metal foil and the corrugated structure are typical values and the invention is not limited to these values.

A subject of the invention is further a metal foil which can be produced according to the above-described method from electrically conductive material with a corrugated structure, running in one direction, on at least a first side of the metal foil, wherein at least the first side of the metal foil has areas that run transverse to the direction of the corrugated structure and are pretinned.

Preferably, notches along which the metal foil can be split into the PV cell connectors are introduced into the metal foil in addition to the corrugated structure at distances from 1 to 5 mm running in the direction of the corrugated structure.

The depths of the notches are expediently selected such that, independently of the thickness of the metal foil, the same residual material thickness always remains in the notches, preferably of less than 40 µm, and in particular in the range of from 10 to 20 µm. The further processing of the metal foil can thereby be standardized. The connectors can then preferably be produced in a total of four steps:

In the first step the metal foil or the copper ribbon preferably from 0.1 to 0.25 mm thick and from 30 to 90 mm wide is guided through a first roll gap, the two work rolls of which have circular protruding wedge-shaped ribs at a distance of 1 to 5 mm which emboss corresponding wedge-shaped notches into the metal foil to such a depth that the material thickness of the metal foil in these notches is reduced to less than 40 µm and preferably between 10 and 20 µm and thus lines of weakness form. The material of the metal foil is slightly pushed out at the edges of the notches, and ridges are formed. The metal foil is therefore smoothed again in a second roll gap with smooth work rolls. The wedge-shaped notches are largely closed again but the lines of weakness remain and form weakened points. Along these lines of weakness the metal foil is subsequently split into individual ribbons, from which the PV cell connectors are separated.

In the second step the metal foil weakened along these weakened points is guided through a third roll gap which is a roll gap of the rolling mill already mentioned above, in which at least one work roll has a surface with the corrugated structure with the result that a corrugated structure is embossed into the metal foil. The corrugated structure has a peak-to-peak distance of 150-250 µm and a depth of approximately 30 to 50 µm. If possible the metal foil is introduced into the third roll gap such that the lines of weakness coincide with a peak of the corrugated structure of the work rolls and accordingly with a trough of the corrugated structure of the metal foil. However, this does not always occur and is also not necessary.

In the third production step as mentioned above only those sections of the corrugated metal foil which then later form the connector cut-offs which are soldered to the PV cells are pretinned.

In the fourth production step the corrugated metal foil pretinned in transverse strips is split into narrow ribbons of foil along the lines of weakness. For this, the metal foil is guided through a fourth roll gap. A separator is arranged after the fourth roll gap, e.g. a fixed separating roll or a separating wedge, and adjacent foil ribbons are alternately guided over and under the separator and thereby broken along the lines of weakness and separated from one another. The metal foil is expediently split in the hardened state, wherein the work hardening is carried out by the previous work roll in the first and second production steps. Each thus-obtained foil ribbon is then wound onto a narrow roll or a cross-wound roll. The finished separated and wound band is then also soft annealed.

In an automatic processing method individual connectors can then be cut off from these foil ribbons in known manner and the connector soldered to the front of one PV cell and the back of the following PV cell.

The first and second production step of the connectors can also be combined by guiding the metal foil through a first roll gap the two work rolls of which have, 2 to 5 mm apart, circular protruding wedge-shaped ribs and between them a surface with a corrugated structure with a peak-to-peak distance of 150-250 µm and a depth of approximately 30 to 50 µm. However, smooth-rolling of the edge ridges of the wedge-shaped notches must be dispensed with, as the corrugated structure between the notches would thereby also be smoothed.

This four-step method can also be used with an axis-parallel corrugated structure of the roll(s) of the third roll gap, wherein the ribs of the work roll(s) of the first roll gap then also run axis-parallel.

These four production steps can be carried out in a clocked or continuous process. With a clocked process, the metal foil is wound up after the embossing (first and second production step) and then unwound again for the melting on of the solder preforms (third production step). The solder preforms are melted on by means of the above-mentioned second hot embossing head, which is stationary. Then the pretinned metal foil is again unwound. This is expedient in particular because the metal foil is transported at a uniform speed in the first two and in the fourth production steps, while in the third production step (pretinning) it is moved forwards stepwise according to the length of the solder preforms.

With a continuous process, the metal foil is also selectively covered with the solder preforms in the third production step in a continuous operation. The action of applying the solder preforms runs together with the metal foil, and a silicon-coated roll is used for the melting on instead of the hot embossing head. Here too the metal foil can be wound up in between if the production steps run at different speeds of the metal foil.

The width of the foil used and of the ribbon finally produced can also be a multiple of the width or length of the PV connectors. The ribbons are then firstly wound up in this wider form and not cut to the final measurement in longitudinal direction or transverse direction until before soldering to the PV cells.

Figure 2:
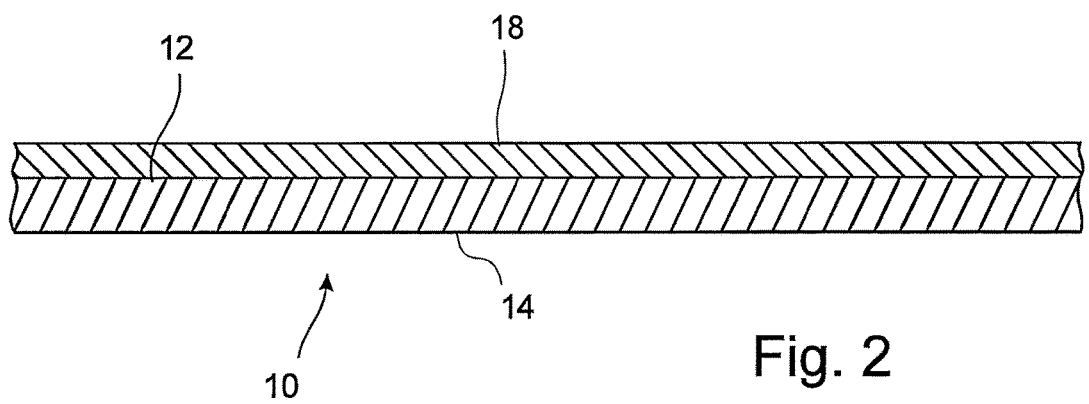
Figure 3:
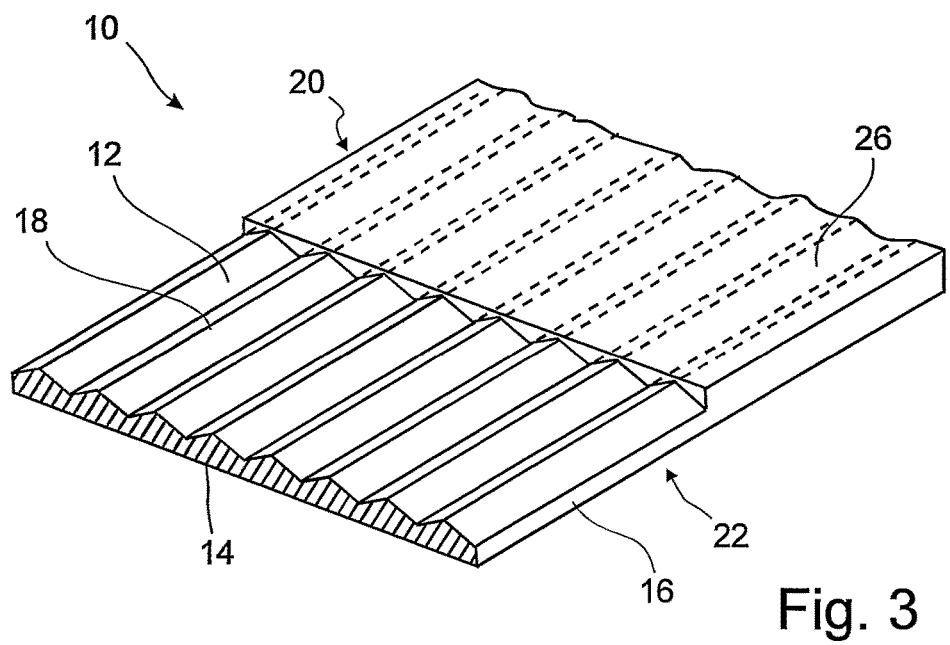
Figure 4:
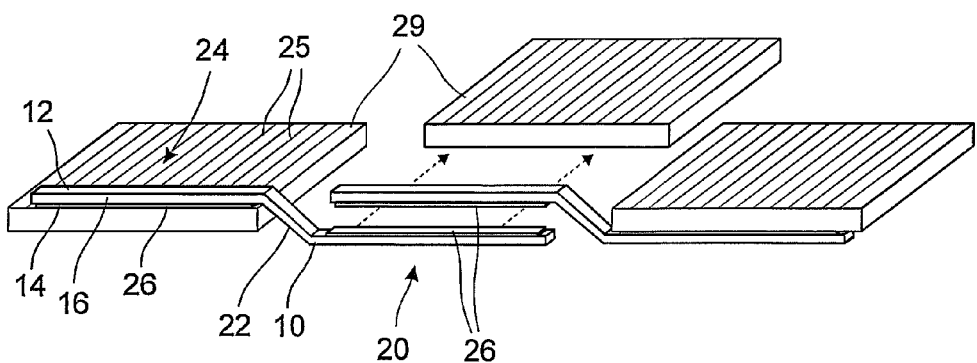
Figure 5:
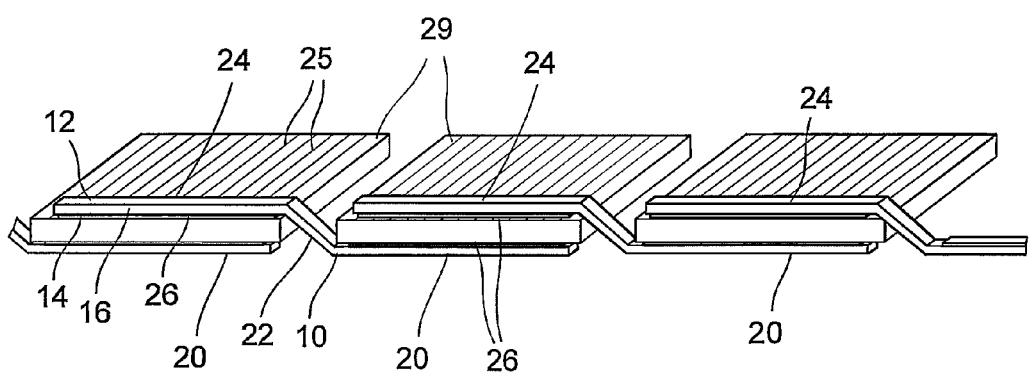
Figure 6:
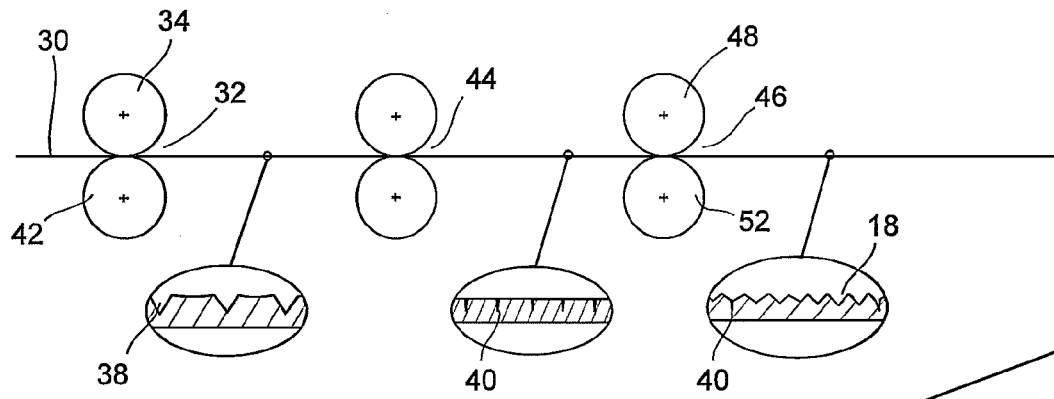
Figure 6:
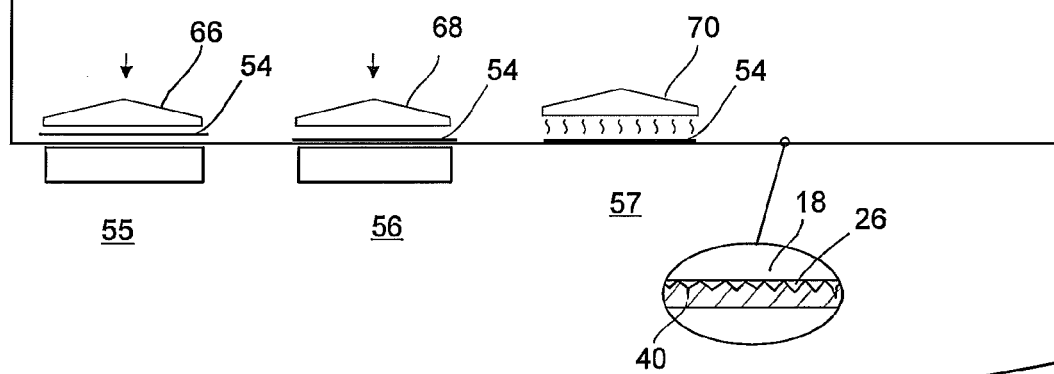
Figure 6:
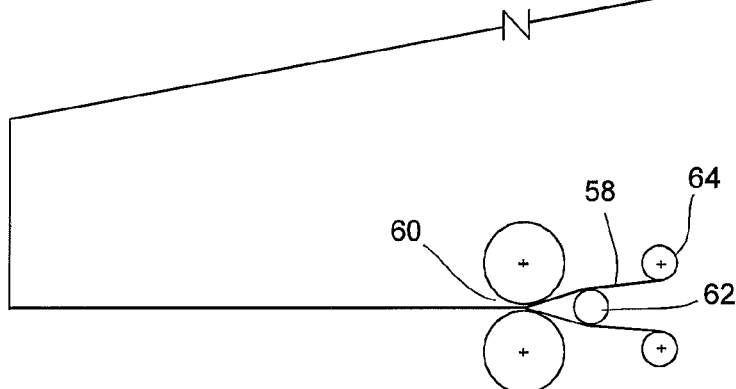
Figure 7:
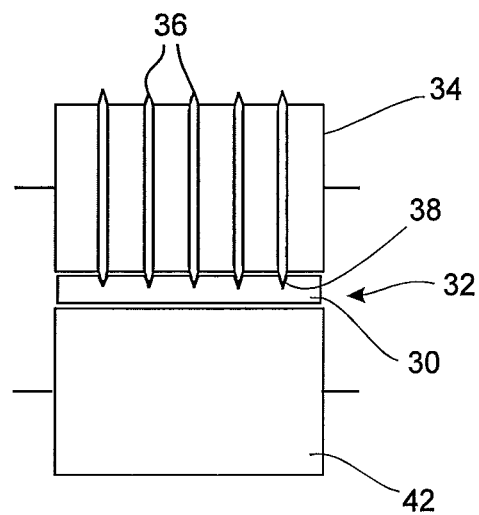
Figure 8:
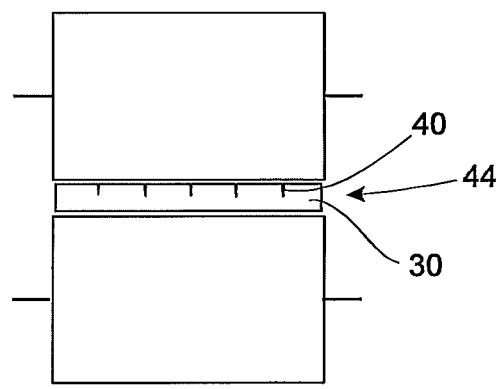

An embodiment example of the invention is described below in more detail with the help of the drawings. There are shown in:

FIG. 1 a connector for PV cells in cross-section;

FIG. 2 the connector from FIG. 1 in longitudinal section;

FIG. 3 the connector for PV cells in a three-dimensional isometric representation;

FIG. 4 in an exploded view three PV cells with the associated connectors;

FIG. 5 the three PV cells from FIG. 4 connected;

FIG. 6 schematically, the production method of the connectors for PV cells;

FIG. 7 the first roll gap in section;

FIG. 8 the second roll gap in section; and

Figure 9:
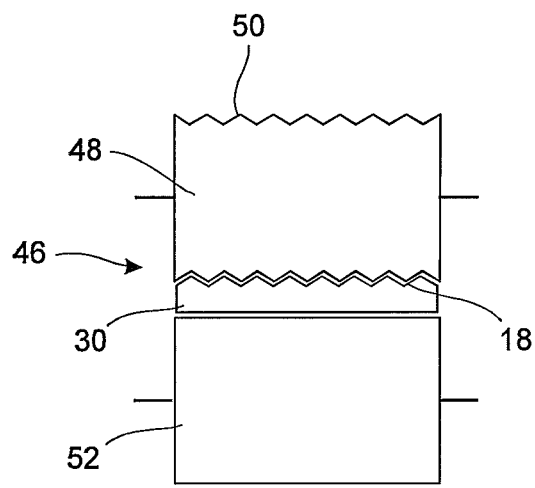

FIG. 9 the third roll gap in section.

By means of the method according to the invention, a pretinned connector for PV cells 29 (FIGS. 4 and 5) is to be produced, which is a strip 10 with a flat cross-section and a first, top broad side 12 and a second, bottom broad side 14 as well as two narrow sides 16, each of which connects the opposite walls of the broad sides 12, 14. The cross-section of the strip 10 is 1 mm wide and 0.1 mm high (FIG. 1). The strip 10 has a copper core and on its top and bottom broad sides a thin layer of silver to improve electrical conductivity and reflection capability. The layer of silver is not shown in the drawings.

While the bottom broad side 14 is smooth, the top broad side 12 has a corrugated structure 18 with a triangular profile (FIG. 1) with an angle α of 120° at the peak and in the trough. The peak-to-peak distance in the corrugated structure 18 is 150 µm and the depth of the corrugated structure is accordingly approximately 40 µm. The strip is 305.5 mm long and is divided into three areas. In a first area 20, 145 mm long, the strip is pretinned on the top broad side 12 which holds the corrugated structure 18, and the corrugated structure 18 is filled with the soldering tin 26 such that viewed from the outside the strip 10 in the first area 20 is almost smooth. The soldering tin 26 actually stands a few micrometers higher than the peaks of the corrugated structure 18. An intermediate area 22, in which the strip 10 is not tinned either on the top broad side 12 or on the bottom broad side 14, joins onto the first area 20. The intermediate area 22, which acts as connection area, is 15 mm long. A second area 24, which again is 145 mm long and which has a pretinned bottom broad side 14, joins onto it. The thickness of the pretinning is approximately 10 µm.

Including a cutting tolerance of 0.5 mm, the length of the strip 10 is thus 305.5 mm. The length of the first and second areas 20, 24 is somewhat less than the length of the edge of a six-inch cell (FIGS. 4 and 5). The connection area 22 corresponds to the distance between two PV cells 29 within a module. The bottom broad side 14 of the second area 24 is soldered to the top of a PV cell 29 with the result that a connection to the individual contact fingers 25 of the PV cell 29 forms. As the PV cells 29 are connected in series, the first area 20, in which the corrugated structures 18 are completely filled with soldering tin 26, is soldered to the bottom of the adjacent PV cell 29, with the result that there is likewise contact with the contact fingers. The second area 24 of the next connector, the first area 20 of which is again soldered to the bottom of the next-but-one PV cell 29, is then soldered onto the top of this PV cell 29. In this way a majority of PV cells is connected in series.

The pretinned connectors for PV cells with a corrugated structure on one side are produced in four steps (FIG. 6), wherein a clocked process is described here:

In a first step a copper foil or ribbon 30, 0.1 mm thick and 30 mm wide, is guided through a first roll gap 32, the top work roll 34 of which has circular protruding wedge-shaped ribs 36 spaced 1 mm apart, which emboss corresponding wedge-shaped notches 38 into the copper foil 30 to a depth of 80 μm (FIG. 7), with the result that lines of weakness 40 form (FIGS. 6 and 8). The bottom work roll 42 is smooth. The material of the copper foil 30 is slightly pushed out at the edges of the notches 38 and thus ridges form. The copper foil 30 is therefore smoothed again in a second roll gap 44 with smooth work rolls. The wedge-shaped notches 38 are largely closed again but the lines of weakness 40 remain and form break-off points (FIG. 8).

In a second step the copper foil 30 is guided through a third roll gap 46, the top work roll 48 of which has a surface with a corrugated structure 50 with a peak-to-peak distance of 150 μm and a depth of approximately 40 μm (FIG. 9). The corrugated structure 50 has longitudinal crests or peaks and troughs. The angle α at the crests and in the troughs of the corrugated structure 50 is 120°. The bottom work roll 52 of the third roll gap 46 is smooth. In the third roll gap 46 the corrugated structure 50 of the top work roll 48 embosses the corresponding corrugated structure 18 into the copper foil 30. The copper foil 30 is introduced into the third roll gap 46 such that the lines of weakness 40 coincide with a crest of the corrugated structure 50 of the top work roll 48 and accordingly with a trough of the corrugated structure 18 embossed into the copper foil 30.

In a third production step those sections of surface of the copper foil 30 which later become the first areas 20 of the top broad side 12 and the second areas 24 of the bottom broad side 14 of the connector which are soldered to the PV cells 29 are then pretinned. For this, soldering tin is applied to the copper foil 30 in the form of solder preforms 54 (FIG. 6). The soldering flux necessary for the tinning has been applied to the solder preforms 54 in advance. The solder preforms 54 are connected to the copper foil 30 by means of a three-stage method. In the first stage the solder preforms 54 are temporarily attached by pointwise hot embossing by means of a first hot embossing head 66 which has two embossing stamps. In doing so, a pre-cut solder preform 54 is placed in position and held on the temporarily attached copper foil 30 by means of a suction gripper. The suction gripper has two spaced recesses through which the two dies of the first hot embossing head move and at these points temporarily attach the solder preform 54 to the copper foil 30 by heat and pressure. The copper foil 30 with the temporarily attached solder preform 54 is then clocked further and in the second stage the solder preforms 54 are again pressed over their whole surface by hot embossing by means of a second hot embossing head 68. The copper foil 30 with the pressed solder preform 54 is then clocked further again and in the third stage the temporarily attached solder preforms 54 that have been pressed over their whole surface are melted on by means of an infrared radiator 70.

The solder preforms 54 are strips of soldering tin, the width of which is somewhat less than the 156-mm length of the edge of a six-inch PV cell at 145 mm. The soldering tin strips 54 are laid transverse to the corrugated structure 18 of the copper foil 30.

In a fourth production step the corrugated copper foil 30, pretinned in transverse strips, is split into narrow ribbons of foil 58 along the lines of weakness 40. For this, the copper foil 30 is guided through a fourth roll gap 60 with smooth work rolls which exert no, or only a minimal, pressure on the foil 30. A fixed separating roll 62 is arranged as separator after the roll gap, and adjacent foil ribbons 58 are alternately guided over and under the separating roll 62 and separated from one another along the lines of weakness 40. Each thus-obtained foil ribbon 58 is then wound onto a cross-wound roll 64.

If the copper foil 30 is not to have lines of weakness 40, the first and second roll gaps 32, 44 are omitted. The copper foil 30, provided with the corrugated structure 18 and pretinned, is then divided into the foil ribbons 58 by means of roll slitters.

As the first two and the fourth production step proceed continuously, while the metal foil 30 is moved forwards in steps in the third production step, the pretinning, the metal foil 30 is wound up after the first two production steps and then unwound for the third production step. Likewise it is wound up after the third production step and then unwound again for the fourth production step. The interim winding up is shown in FIG. 6 by the breaks in the line representing the copper foil 30. The copper foil 30 can also be temporarily wound up after passing through the first and second roll gap 32, 44.

The strips 10 of the PV cell connectors usually have a corrugated structure 18 on the bottom and top broad side. To produce such a PV cell connector the bottom work roll 42 of the first roll gap 32 then also has a corrugated structure 50. Areas of both sides of the metal foil 30 are then usually tinned. The tinned areas of the top side and bottom side of the metal foil 30 do not overlap, but are separated in longitudinal direction by a gap which alternately roughly corresponds to the distance between two PV cells 29 to be connected to one another and a cutting tolerance of 0.5 mm.

Both sides of the metal foil 30 can also be tinned over their whole surface. PV cell connectors cut out from this can then be used for PV cells of any size. However, the advantageous reflection properties are then lost. Expediently therefore at least one side of the metal foil 30 should be tinned only in the areas which, after separation into PV cell connectors, form the first areas 20 of the top broad side 12 of the PV cell connectors with which this is soldered to the bottom of a PV cell 29.

| List of reference numbers | |
| --- | --- |
| 10 | strip |
| 12 | top broad side |
| 14 | bottom broad side |
| 16 | narrow side |
| 18 | corrugated structure of strip/foil |
| 20 | first area |
| 22 | intermediate area |
| 24 | second area |
| 25 | contact finger |
| 26 | soldering tin |
| 29 | PV cell |
| 30 | copper foil |
| 32 | first roll gap |
| 34 | top roll |
| 36 | ribs |
| 38 | notches |
| 40 | lines of weakness |
| 42 | bottom work roll |
| 44 | second roll gap |
| 46 | third roll gap |
| 48 | top work roll |
| 50 | corrugated structure of the work roll |
| 52 | bottom work roll |
| 54 | solder preforms |
| 55 | first stage (pointwise hot embossing) |

| List of reference numbers | |
|---|---|
| 56 | second stage (whole-surface hot embossing) |
| 57 | third stage (melting on) |
| 58 | foil ribbons |
| 60 | fourth roll gap |
| 62 | separating roll |
| 64 | roll |
| 66 | first hot embossing head |
| 68 | second hot embossing head |
| 70 | infrared radiator |

The invention claimed is:

1. A method for producing pretinned strips of connectors for PV cells, with the steps:
   guiding a metal foil through a roll gap of a rolling mill in which at least one work roll has a surface with a corrugated structure with the result that a corrugated structure which has crests or peaks and troughs is embossed into at least one side of the metal foil,
   applying soldering tin in the form of strips of solder preforms to the side of the metal foil with the embossed corrugated structure, wherein soldering flux necessary for the tinning has been applied in advance to the solder preforms or the metal foil,
   temporarily attaching the strips of solder preforms to the metal foil by hot embossing,
   melting the strips of solder preforms onto the metal foil wherein the strips of solder preforms have a thickness such that the corrugated structure is at least full after melting the strips of solder preforms, and
   separating the pretinned metal foil which has the embossed corrugated structure into parallel ribbons.

2. The method according to claim 1, wherein the temporarily attaching, comprises pointwise hot embossing, the strips of solder preforms to the metal foil, then pressing the temporarily attached strips of solder preforms over their whole surface onto the metal foil, and finally melting the temporarily attached strips of solder preforms.

3. The method according to claim 1, wherein the melting takes place by placing the strips of solder preforms onto the metal foil to which soldering flux has been applied in advance, gently pressing the strips of solder preforms onto the metal foil so that they do not slip, and melting the strips of solder preforms.

4. The method according to claim 1, wherein the roll gap is formed by two work rolls, both work rolls having a surface with a corrugated structure, with the result that a corrugated structure is embossed into both sides of the metal foil, wherein both sides of the metal foil comprise pre-tinned areas, and wherein the pre-tinned areas on one side of the metal foil are separated from the pre-tinned areas on the other side of the metal foil by a gap extending in longitudinal direction.

5. The method according to claim 1, wherein the soldering tin stands slightly higher than the peaks of the corrugated structure after melting.

6. The method according to claim 1, wherein the metal foil is 0.1 to 0.25 mm thick and 30 to 90 mm wide and the work rolls have a circular corrugated structure.

7. A method for producing pretinned strips of connectors for PV cells, with the steps:
   guiding a metal foil through a roll gap of a rolling mill in which at least one work roll has a surface with a corrugated structure with the result that a corrugated structure which has crests or peaks and troughs is embossed into at least one side of the metal foil,
   applying soldering tin in the form of solder preforms to the side of the metal foil with the embossed corrugated structure, wherein soldering flux necessary for the tinning has been applied in advance to the solder preforms or the metal foil,
   melting the solder preforms onto the metal foil wherein the solder preforms have a thickness such that the corrugated structure is at least full after melting the solder preforms, and
   separating the pretinned metal foil which has the embossed corrugated structure into parallel ribbons, wherein the metal foil is guided through a first roll gap, in which at least one work roll has circular protruding wedge-shaped ribs at a distance of 1 to 5 mm which emboss corresponding wedge-shaped notches into the metal foil to such a depth that the residual material thickness of the metal foil in the area of these notches is reduced to between 10 and 40 µm and thus lines of weakness form.

8. The method according to claim 7, wherein the metal foil is guided through a second roll gap with smooth work rolls, whereby ridges pushed out at the edges of the notches are smoothed again.

9. The method according to claim 1, wherein only one of the work rolls of the rolling mill has a surface area with the corrugated structure, with the result that a corrugated structure is embossed into only one side of the metal foil.

* * * * *